United States Patent
McCollum et al.

(10) Patent No.: US 6,850,136 B2
(45) Date of Patent: Feb. 1, 2005

(54) MAGNETORESISTIVE BASED ELECTRONIC SWITCH

(75) Inventors: David R. McCollum, Cedarville, IL (US); Wayne L. Ehlers, Lanark, IL (US); Michael J. Skarlupka, Freeport, IL (US)

(73) Assignee: Honeywell International Inc., Morristown, NJ (US)

( * ) Notice: Subject to any disclaimer, the term of this patent is extended or adjusted under 35 U.S.C. 154(b) by 49 days.

(21) Appl. No.: 10/234,962

(22) Filed: Sep. 4, 2002

(65) Prior Publication Data

US 2004/0041685 A1 Mar. 4, 2004

(51) Int. Cl.[7] ............................................. H01H 9/00
(52) U.S. Cl. ....................................................... 335/205
(58) Field of Search ................................. 335/205–207

(56) References Cited

U.S. PATENT DOCUMENTS

| | | | |
|---|---|---|---|
| 4,392,375 A | * 7/1983 | Eguchi et al. ............. 73/118.1 |
| 4,520,311 A | * 5/1985 | Petr et al. ............... 324/117 R |
| 5,497,082 A | 3/1996 | Hancock |
| 5,500,590 A | 3/1996 | Pant |
| 5,570,015 A | * 10/1996 | Takaishi et al. ........ 324/207.21 |
| 5,672,857 A | 9/1997 | Frost et al. |
| 5,714,728 A | 2/1998 | Garneyer et al. .......... 200/81.5 |
| 5,886,556 A | 3/1999 | Ganger et al. |
| 5,959,268 A | 9/1999 | Hirschfeld |
| 6,133,732 A | 10/2000 | Hayashi |
| 6,150,808 A | * 11/2000 | Yagyu et al. ........... 324/207.21 |
| 6,223,571 B1 | 5/2001 | Rector ......................... 70/276 |
| 6,246,307 B1 | 6/2001 | Friedman |
| 6,297,628 B1 | 10/2001 | Bicking et al. |
| 6,297,718 B1 | 10/2001 | Scholz |
| 6,356,074 B1 | 3/2002 | Ohkawa et al. |
| 6,392,515 B1 | 5/2002 | Van Zeeland |

* cited by examiner

*Primary Examiner*—Ramon M. Barrera
(74) *Attorney, Agent, or Firm*—Kris T. Fredrick; Kermit D. Lopez; Luis M. Ortiz

(57) ABSTRACT

A magnetoresistive-based electronic switching apparatus and method. A housing having a first compartment contains switching electronics and a second compartment contains an actuation assembly. A barrier can separate the first compartment from the second compartment. An actuating magnet can be associated with the actuation assembly within the second compartment. The actuating magnet provides a magnetic field that can activate a magnetoresistive device located within the first compartment. Additionally, a magnetoresistive device responsive to the magnetic field of the actuating magnet can be utilized, wherein the magnetoresistive device located within the first compartment in association with the switching electronics provides a solid-state magnetoresistive switch thereof.

17 Claims, 5 Drawing Sheets

MAGNETORESISTIVE BASED ELECTRONIC SWITCH

TECHNICAL FIELD

The present invention relates to mechanically actuated switches. The present invention also relates to magnetoresistive devices. The present invention additionally relates to switches utilized in commercial and military aviation applications. The present invention also relates to actuation assemblies and actuation plungers.

BACKGROUND OF THE INVENTION

Switching devices are utilized widely in industrial and commercial applications. Switches come in a variety of shapes and sizes. Some are large and cumbersome, while others are produced at the micro mechanical level. A particular need exists for mechanically actuated switches that are small in size, highly reliable, exhibit high accuracy, and can operate in harsh environments. This type of switch is typically required for use in commercial and military aviation applications. For example, such switches must be able to operate in particularly cold environments such as the Arctic or at extremely high altitudes, while other switches must be able to operate under difficult pressures, such as that experienced by submarines.

The operation of switches that are utilized for such applications is typically based on a set of metallic contacts that are actuated to accomplish the switching action. The moving parts associated with such switch contacts can wear and cause unreliable switch operation. The moving parts of such switches also provide a leak path that must generally be sealed to prevent contamination of the switch contacts. An additional problem experienced with conventional switches is that the contacts can become oxidized during normal use and fail to switch at low currents and at low voltage loads.

The present inventors have concluded, based on the foregoing, that the need for an improved mechanically actuated switch can be solved through the use of a unique switch arrangement, which is described in greater detail herein. In particular, the present inventors believe that the use of magnetoresistive-based devices can improve the operating life and efficiency of a mechanically actuated switch.

Magnetoresistive devices are well known in the art. A magnetoresistor (MR) is typically configured as a two terminal device that changes its resistance in accordance with a variation in a magnetic field. Almost every conducting material exhibits some magnetoresistance. The magnetoresistive effect, however, is particularly large in permalloys, which include nickel-iron alloys, and other ferromagnetic materials. Because magnetoresistive-based devices are very sensitive to magnetic fields, the present inventors believe such devices will find useful applications in switches.

An example of a magnetoresistive-based device is a magnetoresistive sensor. Magnetoresistive sensors are utilized in many solid-state applications. These include, for example, automotive, marine, military, industrial, aircraft and space applications. Signature detection systems make use of magnetoresistive sensors for traffic and vehicle control, mine detection and weapons systems, and metal detection such as mining, separation and security. In addition, magnetoresistive sensors have been utilized for anomaly detection such as proximity detection and position detection, whether angular or linear. To date, however, magnetoresistive devices have not been utilized successfully to implement mechanically actuated switching devices.

An example of a magnetoresistive sensor is disclosed in U.S. Pat. No. 5,500,590, "Apparatus for Sensing Magnetic Fields Using a Coupled Film Magnetoresistive Transducer" to Bharat B. Pant, which issued on Mar. 19, 1996, and is assigned to Honeywell Inc. ("Honeywell") of Minneapolis, Minn. U.S. Pat. No. 5,500,590 generally describes a first magnetically coupled film sensing element and a second magnetically coupled film sensing element that are arranged to change resistance in response to a magnetic field when biased by a current through the elements. A current carrying conductor spaced from the elements sets the magnetization in the elements. A transfer function of the elements is adjusted by varying the current through the elements or the current through the conductor.

Another example of a magnetoresistive sensor is disclosed in U.S. Pat. No. 5,497,082, "Quadrature Detector with a Hall Effect Element and a Magnetoresistive Element," which issued to Peter G. Hancock on Mar. 5, 1996, and is also assigned to Honeywell. U.S. Pat. No. 5,497,082 describes a position sensor with the capability of detecting a quadrature signal by the provision of first and second magnetically sensitive devices. The first magnetically sensitive device comprises a Hall effect element or some other device, which is capable of sensing strength of a component of a magnetic field, and which is perpendicular to a pre-selected plane. A second magnetically sensitive device is provided that is capable of sensing the component of a magnetic field lying in the same plane.

Thus, the present inventors have concluded that the use of a magnetoresistive device in association with a mechanically actuated switch can result in improved switching action, while avoiding the aforementioned problems, such as oxidation of the contacts and undesirable part wear.

SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole. Additional objects and advantages of the current invention will become apparent to one of ordinary skill in the art upon reading the specification.

It is therefore one aspect of the present invention to provide an improved electronic switch.

It is another aspect of the present invention to provide a magnetoresistive-based electronic switch.

It is a further aspect of the present invention to provide a magnetoresistive-based electronic switch having separate compartments for switching electronics and associated magnetic actuation mechanisms.

It is an additional aspect of the present invention to provide a method for forming a magnetoresistive-based electronic switch.

It is also an aspect of the present invention to provide a mechanically actuated switch that is small in size, highly reliable, exhibits high accuracy, and is operable in harsh environments.

The above and other aspects can be achieved as is now described. An apparatus and method for magnetoresistive-based electronic switching is disclosed herein. Generally, the present invention comprises a housing having a first compartment that contains switching electronics and a second compartment that contains an actuation assembly. A barrier can be utilized to separate the first compartment from the second compartment. The housing itself can be produced from a plurality of walls formed from a non-magnetic material. An actuating magnet can be associated with the actuation assembly within the second compartment, such that the actuating magnet possesses a magnetic field that activates one or more magnetoresistive devices located within the first compartment. The actuation assembly can be configured to include an actuating plunger that contains the actuating magnet. A spring or other urging member (e.g., a rod, a spacer, a hinged member, a collapsible and compressible material, etc.) can also be utilized to hold the actuating magnet in place to provide an actuating force thereof. Additionally, the switching electronics can be surrounded by an electronics enclosure to protect against contamination, mechanical shock, and vibration. Also, a magnetoresistive device can be provided, which is responsive to the magnetic field of the actuating magnet, wherein the magnetoresistive device can be located within the first compartment in association with the switching electronics to provide a solid-state magnetoresistive switch thereof.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and together with the detailed description of the invention, serve to explain the principles of the present invention.

DETAILED DESCRIPTION OF THE INVENTION

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

Figure 1:
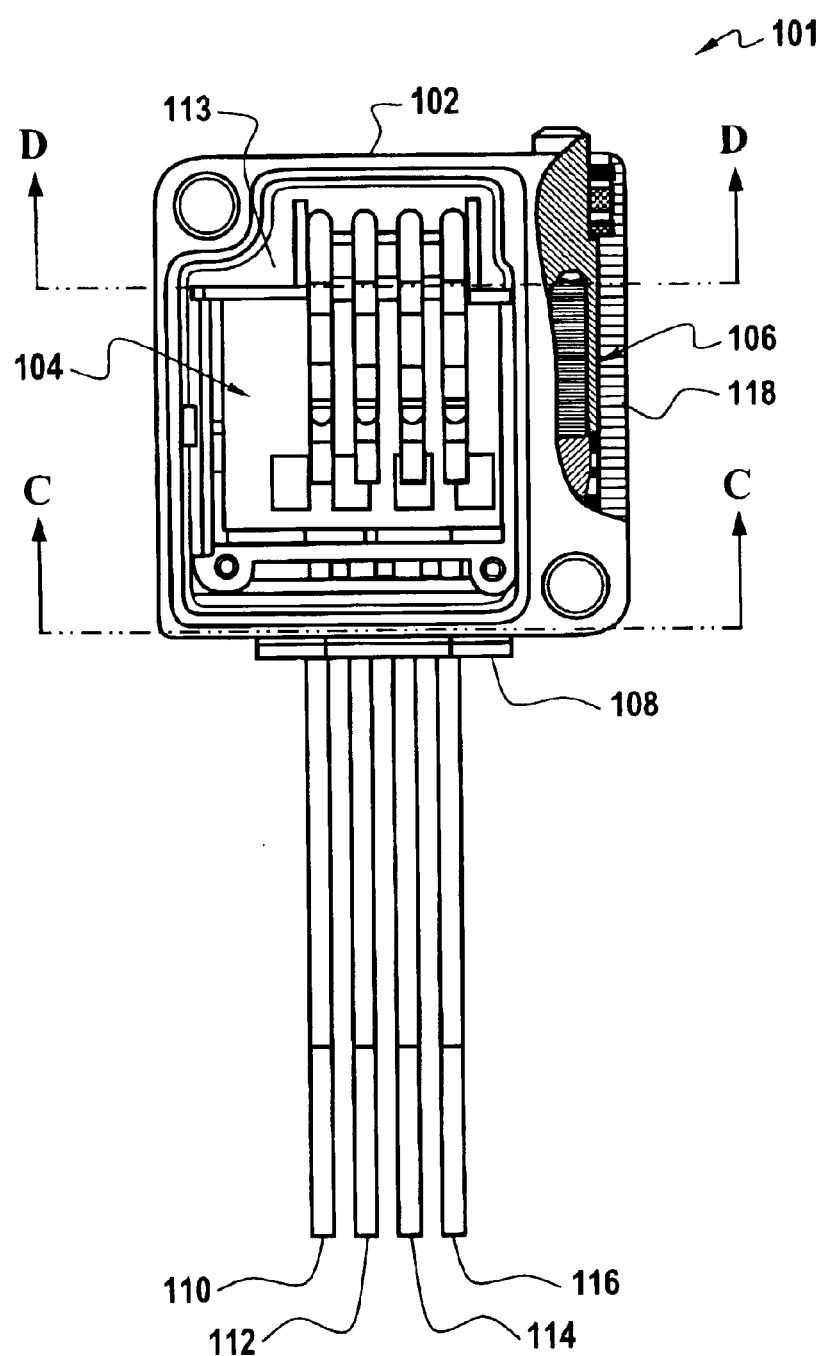
FIG. 1 illustrates a front view of a magnetoresistive-based electronic switch, shown along a front cross-section, in accordance with a preferred embodiment of the present invention.
Figure 2:
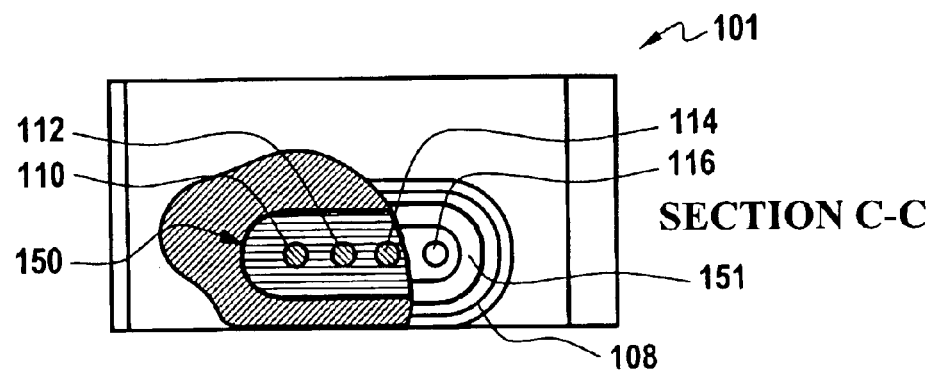
FIG. 2 illustrates a bottom view along section C—C of the magnetoresistive-based electronic switch illustrated in FIG. 1, in accordance with a preferred embodiment of the present invention.
Figure 3:
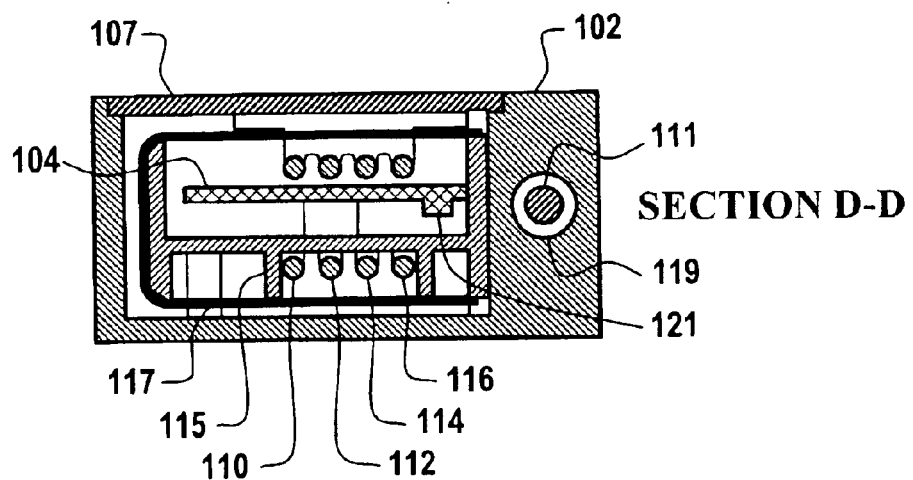
FIG. 3 illustrates a bottom view along section D—D of the magnetoresistive-based electronic switch illustrated in FIG. 1, in accordance with a preferred embodiment of the present invention.
Figure 4:
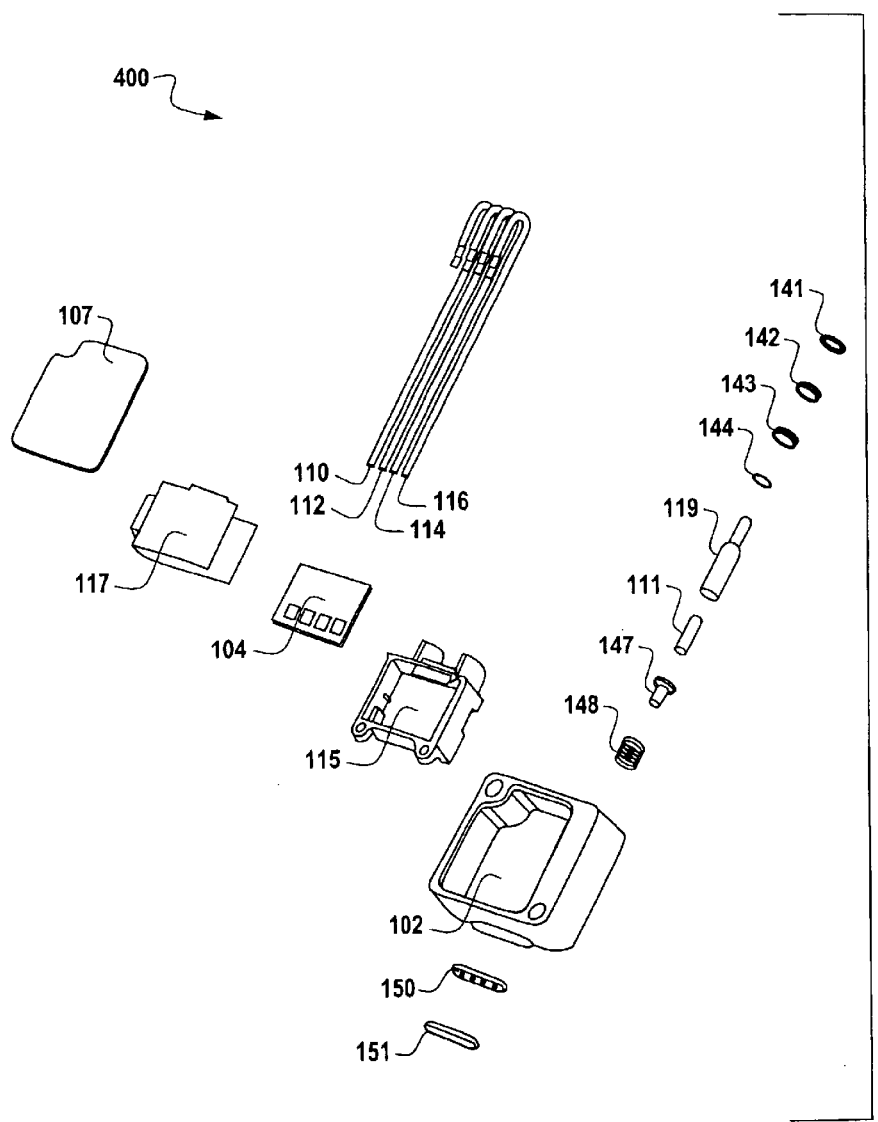
FIG. 4 illustrates an exploded view of the magnetoresistive-based electronic switch illustrated in FIG. 1, in accordance with a preferred embodiment of the present invention.

FIG. 1 illustrates a front view of a magnetoresistive-based electronic switch 101, shown along a front cross-section, in accordance with a preferred embodiment of the present invention. FIG. 2 illustrates a bottom view, of magnetoresistive-based electronic switch 101 shown along a section C—C, in accordance with a preferred embodiment of the present invention. Similarly, FIG. 3 illustrates a bottom view of magnetoresistive-based electronic switch 101 shown along a section D—D, in accordance with a preferred embodiment of the present invention. FIG. 4 depicts an exploded view of magnetoresistive-based electronic switch 101. Note that in FIGS. 1–4, like or analogous parts are indicated by identical reference numerals. Thus, FIGS. 1–4 as indicated herein provide varying views of the same magnetoresistive-based electronic switch 101.

Switch 101 includes a housing 102 that includes a first compartment 113, which contains switching electronics 104. Housing 102 also includes a second compartment 118, which can contain an actuation assembly 106. A barrier can be utilized to separate the first compartment 113 from the second compartment 118. Housing 102 is also generally connected to a housing portion 108 for supporting lead wires 110, 112, 114, and 116. Housing portion 108 provides a design feature of housing 102 that can be "formed" or "bent" in order to capture or lock a lead wire sealing grommet or seal gasket 150 in place and also to contain sealing epoxy around the lead wires 110, 112, 114 and 116. The rubber grommet or seal gasket 150 and a flat washer 151 also provide support to housing 102.

As depicted in FIG. 3, an actuating magnet 111 can be associated with the actuation assembly 106 (i.e., shown in FIG. 1). The actuating magnet 111 can provide a magnetic field that activates a magnetoresistive device 121 located within the first compartment 113. The actuation assembly 106 can be configured to include an actuating plunger 119 that contains the actuating magnet 111. A spring can also be provided for holding the actuating magnet 111 in place to provide an actuating force thereof. Note that such a spring is not illustrated in FIG. 3, but is depicted as spring 148 in FIG. 4. The housing 102 can be formed from walls composed of a non-magnetic material. A cover 107 can also support housing 102.

As indicated in FIG. 1, the switching electronics 104 can be surrounded by an electronics enclosure to protect against contamination, mechanical shock, vibration, and other external forces. The switching electronics 104 can specifically be contained in a plastic carrier 115, which is shown in FIG. 3 and which provides an enclosure for electrical isolation and protection against contamination, mechanical shock, and vibration, etc. A shield 117 can be further positioned about lead wires 110,112,114, and 116.

As indicated in FIG. 4, a variety of mechanical parts can be provided to configure the magnetoresistive-based electronic switch 101 described herein. For example, a flat washer 141 can be utilized in association with a seal ring 142 and a spacer 143 to provide support to magnetoresistive-based electronic switch 101. Additionally, a washer 144 can be located in juxtaposition to plunger 119, which surrounds magnet 111. Additionally, a spring 148 surrounds a bushing 147, which in turn are both located within a housing 102. As indicated previously, the rubber grommet or seal gasket 150 and a flat washer 151 can provide additional support to housing 102. A chassis 115 also can be utilized in association with the switching electronics 104, shield 117 and cover 107. The magnetoresistive device is responsive to the magnetic field of the actuating magnet 111. The magnetoresistive device 121 is generally located within the first compartment 113 in association with the switching electronics 104 to provide a solid-state magnetoresistive switch 101 thereof.

Figure 5:
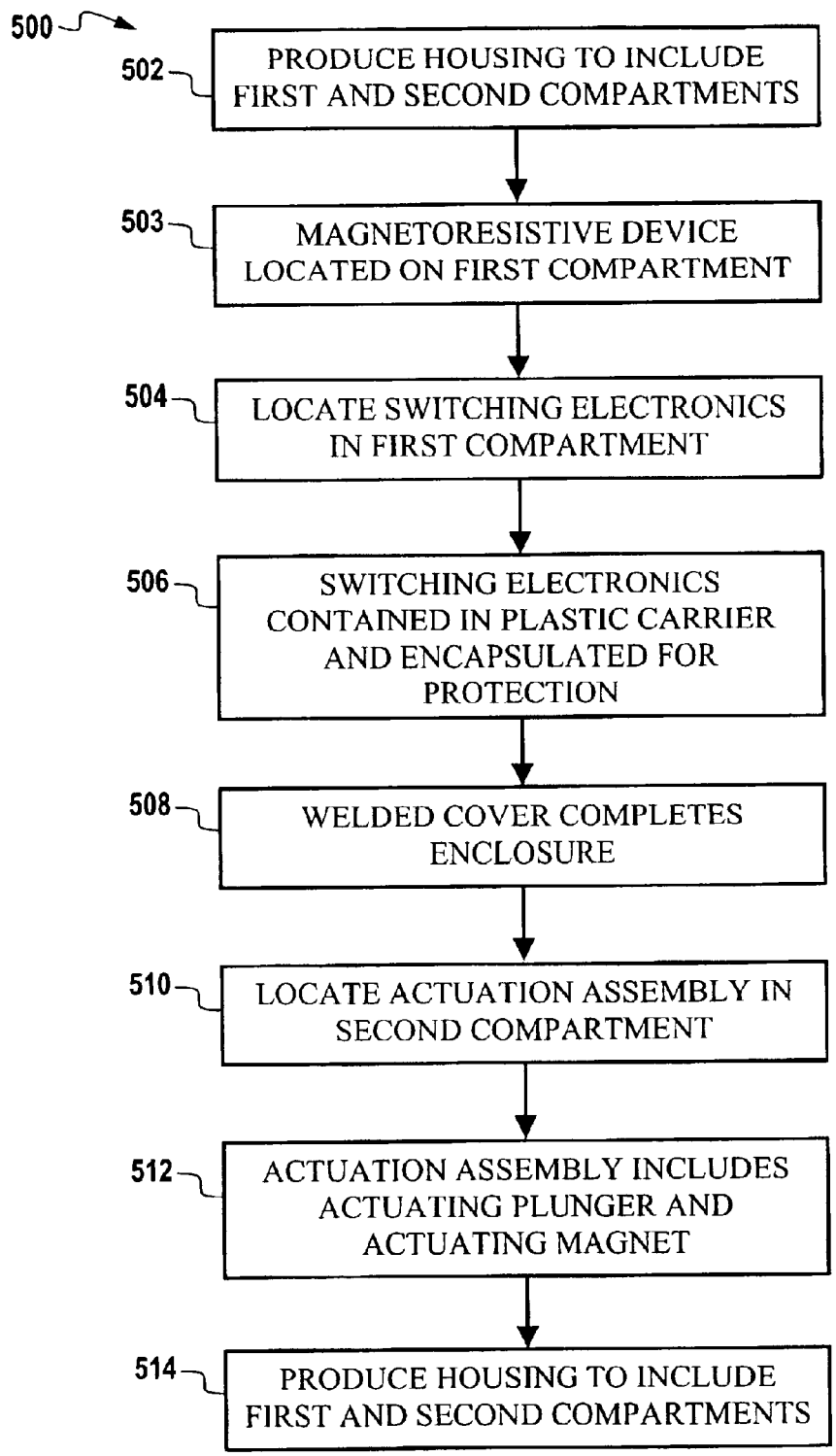
FIG. 5 illustrates a high-level flow chart of operations indicating logical operational steps, in accordance with a preferred embodiment of the present invention.

FIG. 5 illustrates a high-level flow chart 500 of operations indicating logical operational steps, which can be implemented in accordance with a preferred embodiment of the present invention. As illustrated at block 502, the housing 102 can be produced to include a first compartment 113 and a second compartment 118 thereof. As indicated earlier, housing 102 can also be constructed from a plurality of walls formed from a non-magnetic material. For example, the housing 102 can be formed from a variety of materials, such as stainless steel, aluminum, plastic and so forth. As depicted at block 503, a magnetoresistive device can be located within the first compartment 113.

As described next at block 504, switching electronics 104 are generally located in the first compartment 113. Thereafter, as indicated at block 506, the switching electronics 104 can be contained in a plastic carrier and encapsulated for protection against contamination, mechanical shock, vibration, etc. Note that an example of such a plastic carrier is carrier 115, which is depicted in FIG. 3 herein. Next, as illustrated at block 508, further protection of the switching electronics 104 can be provided through the use of a sealed or welded cover (e.g., see cover 107 in FIGS. 3 and 4) to complete the electronics enclosure. The rubber grommet or seal gasket 150 can also be utilized to seal the location where the lead wires 110, 112, 114 and 116 associated with the switching electronics exit the electronics enclosure.

As depicted next at block 510, an actuation assembly can be located in the second compartment 118 of the housing 102. As indicated at block 512, the actuation assembly can include the actuating plunger 119 and the actuating magnet 111. Thereafter, as indicated at block 514, the actuating plunger 119 can be held in place with the spring 148 to provide a suitable actuating force. Note that the actuating plunger 119 generally contains the actuating magnet 111.

The invention described herein thus can accomplish a switching action via electronic means and by a separation of the switching electronics from the actuator of the switch by a solid or semi-rigid barrier. A permanent magnet (e.g., magnet 111) can be attached to the actuation input of the switch. The magnetic field of the magnet activates a magnetoresistive device (e.g., magnetoresistive device 121) that is generally located in a separate compartment of the switch. The magnetoresistive device and associated electronic circuitry thus provide an accurate, highly reliable solid-state on/off switch output.

The magneto-resistance based electronic switch of the present invention can be constructed utilizing a non-magnetic housing, which can have separate compartments for the switching electronics and the actuating plunger (e.g., plunger 119). The actuating plunger contains the actuating magnet and can be held in place with a spring to provide a suitable actuating force. The electronics can be contained in a plastic carrier and encapsulated for protection against contamination, mechanical shock, and vibration. Further protection of the electronics can be provided by use of a welded cover to complete the electronics enclosure. A rubber grommet can be also utilized to seal the location where the switch lead wires exit the electronics enclosure.

Figure 6:
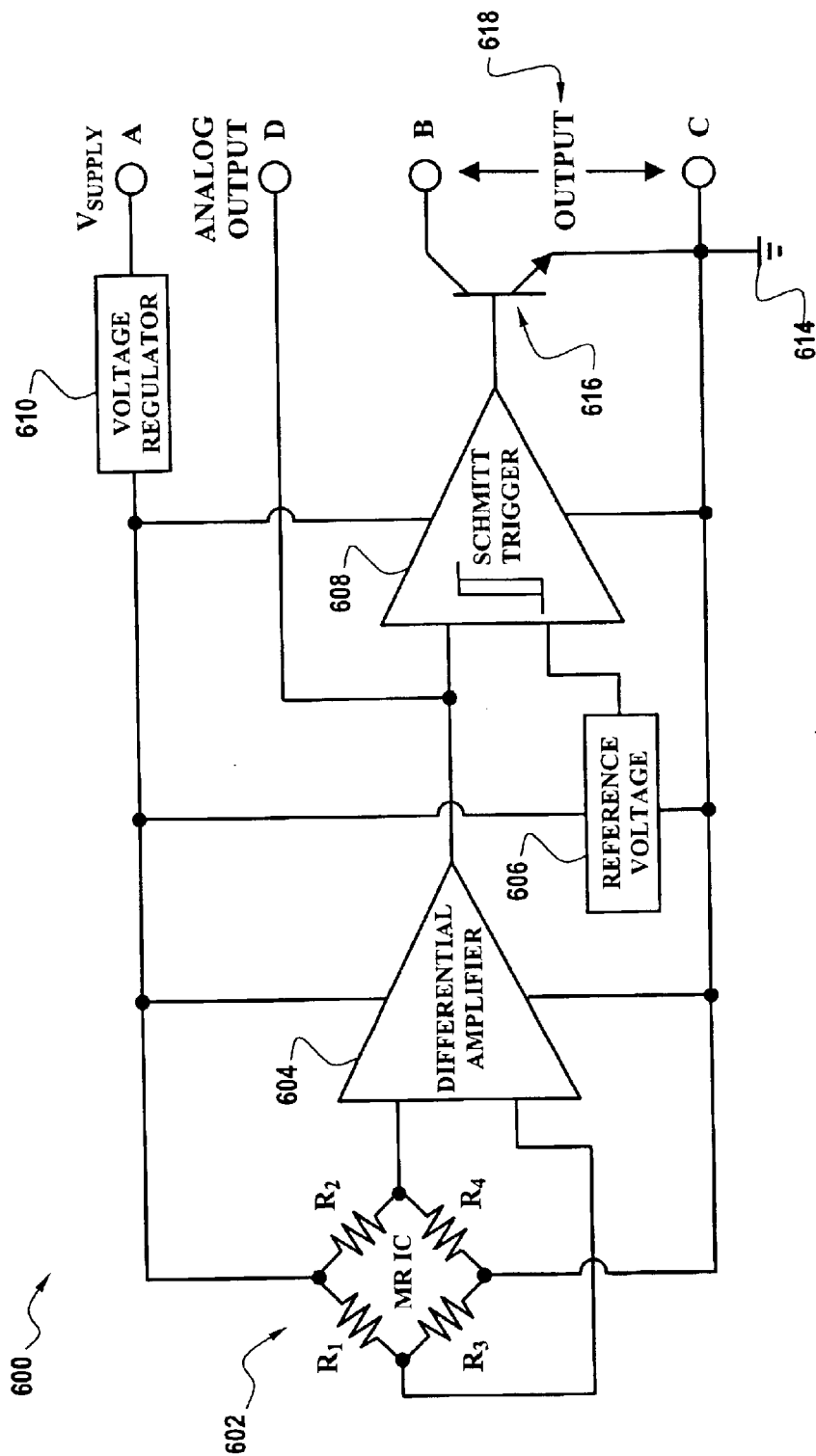
FIG. 6 illustrates a schematic diagram of the switching electronics, which can be implemented in accordance with a preferred embodiment of the present invention.

FIG. 6 depicts a schematic diagram of switching electronics 600 (i.e., a electronic circuit), which can be implemented in accordance with a preferred embodiment of the present invention. The circuit illustrated in FIG. 6 can thus be utilized to implement the switching electronics 104 depicted in FIG. 1. A magnetoresistive bridge 602, which is formed from resistors R1, R2, R3 and R4 can be connected to a differential amplifier 604, which in turn provides input to a Schmitt trigger 608 and provides an analog output at node D, which is located between node A and node B. A voltage supply $V_{supply}$ is present at node A. Additionally, a reference voltage 606 can provide input to Schmitt trigger 608. Output from the Schmitt trigger 608 can be provided as input to a transistor 616, which is coupled to ground 614 at node C, while the overall switching electronics output 618 can be provided between nodes B and C. A voltage regulator is located between node A (i.e., voltage supply) and Schmitt trigger 610. Such switching electronics can thus be located within housing 102 as described herein. Those skilled in the art can of course appreciate that such switching electronics may vary, and that the specific configuration depicted in FIG. 6 is not considered a limiting feature of the present invention.

The embodiment and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

What is claimed is:

1. A magnetoresistive-based electronic switching apparatus, said apparatus comprising:

a housing, wherein said housing includes a first compartment and a second compartment;

a magnetoresistive device, wherein said magnetoresistive device is located within said first compartment of said housing in association with switching electronics thereof;

a sealed cover surrounding said switching electronics, wherein said switching electronics comprise a magnetoresistive bridge formed from a plurality of resistors connected to a differential amplifier, which in turn provides input to a Schmitt trigger thereby providing an analog output;

an actuating magnet that provides a magnetic field, wherein said actuating magnet is located within said second compartment of said housing and wherein said magnetic field activates said magnetoresistive device; and an actuation assembly contained with said second compartment of said housing, wherein said actuation assembly is associated with said actuating magnet to thereby provide an electronic switching apparatus thereof.

2. The apparatus of claim 1 wherein said housing comprises:

a plurality of walls formed from a non-magnetic material; and a single barrier located within said housing, wherein said single barrier separates said first compartment from said second compartment.

3. The apparatus of claim 1 wherein said actuation assembly comprises an actuating plunger, wherein said actuating plunger is located within said second compartment of said housing.

4. The apparatus of claim 3 wherein said actuating plunger contains said actuating magnet.

5. The apparatus of claim 1 wherein said actuation assembly comprises a plunger assembly.

6. The apparatus of claim 1 further comprising:

a spring for holding said actuating magnet in place to provide an actuating force thereof.

7. The apparatus of claim 1 further comprising:

a plastic carrier that encloses said switching electronics for electrical isolation and protection against contamination, mechanical shock and vibration.

8. The apparatus of claim 1 further comprising:

an electronics enclosure surrounding said switching electronics;

at least one switch lead wire exiting said electronics enclosure; and a rubber grommet surrounding at least one switch lead wire, wherein a seal is formed thereof.

9. A magnetoresistive-based electronic switching apparatus, said apparatus comprising:

a housing, wherein said housing includes a first compartment, a second compartment, a barrier that separates said first compartment from said second compartment, and a plurality of walls formed from a non-magnetic material;

switching electronics located within said first compartment, wherein said switching electronics comprise a magnetoresistive bridge formed from a plurality of resistors connected to a differential amplifier, which in turn provides input to a Schmitt trigger thereby providing an analog output;

a magnetoresistive device, wherein said magnetoresistive device is located within said first compartment in association with said switching electronics;

an actuating magnet that provides a magnetic field for activating said magnetoresistive device, wherein said actuating magnet is located within said second compartment of said housing;

an actuation assembly contained within said second compartment of said housing, wherein said actuation assembly is associated with said actuating magnet to thereby provide an electronic switching apparatus thereof;

an electronics enclosure which surrounds said switching electronics for electrical isolation and protection of said switching electronics; and an urging member for holding said actuating magnet in place to provide an actuating force thereof.

10. A method for magnetoresistive-based electronic switching, said method comprising the steps of:

providing a housing having a first compartment and a second compartment;

locating switching electronics within said first compartment and an actuation assembly within said second compartment, such that a barrier separates said first compartment from said second compartment;

providing a magnetoresistive device responsive to a magnetic field of an actuating magnet, wherein said magnetoresistive device is located within said first compartment in association with said switching electronics;

configuring said switching electronics to comprise a magnetoresistive bridge formed from a plurality of resistors connected to a differential amplifier, which in turn provides input to a Schmitt trigger thereby providing an analog output;

encapsulating said switching electronics with a sealed cover; and associating an actuating magnet with said actuation assembly within said second compartment, wherein said actuating magnet possesses a magnetic field that can activate said magnetoresistive device.

11. The method of claim 10 further comprising the step of:

producing said housing from a plurality of walls constructed from a non-magnetic material.

12. The method of claim 10 further comprising the step of:

configuring said actuation assembly to comprise an actuating plunger.

13. The method of claim 12 further comprising the step of:

configuring said actuating plunger to contain said actuating magnet.

14. The method of claim 10 further comprising the step of:

configuring said actuation assembly to comprise a plunger assembly.

15. The method of claim 10 further comprising the step of:

associating said actuating magnet with a spring for holding said actuating magnet in place to provide an actuating force thereof.

16. The method of claim 10 further comprising the step of:

sealing at least one location where at least one switch lead wire exits an electronics enclosure surrounding said switching electronics utilizing a rubber grommet.

17. A method for magnetoresistive-based electronic switching, said method comprising the steps of:

providing a housing having a first compartment and a second compartment;

locating switching electronics within said first compartment and an actuation assembly within said second compartment, such that a barrier separates said first compartment from said second compartment;

providing a magnetoresistive device responsive to a magnetic field of an actuating magnet, wherein said magnetoresistive device is located within said first compartment in association with said switching electronics;

associating an actuating magnet with said actuation assembly within said second compartment, wherein said actuating magnet possesses a magnetic field that can activate said magnetoresistive device; and configuring said switching electronics to comprise a magnetoresistive bridge formed from a plurality of resistors connected to a differential amplifier, which in turn provides input to a Schmitt trigger thereby providing an analog output; and surrounding said switching electronics utilizing a welded cover thereof.

* * * * *